(12) United States Patent
Bougeard

(10) Patent No.: US 9,368,899 B2
(45) Date of Patent: Jun. 14, 2016

(54) PROTECTIVE DEVICE FOR AN ELECTRICAL CONNECTOR OF A POWER ELECTRONICS MODULE

(71) Applicant: RENAULT s.a.s., Boulogne Billancourt (FR)

(72) Inventor: Stephan Bougeard, Trappes (FR)

(73) Assignee: RENAULT s.a.s., Boulogne Billancourt (FR)

( * ) Notice: Subject to any disclaimer, the term of this patent is extended or adjusted under 35 U.S.C. 154(b) by 66 days.

(21) Appl. No.: 14/360,398

(22) PCT Filed: Nov. 20, 2012

(86) PCT No.: PCT/EP2012/073129
§ 371 (c)(1),
(2) Date: May 23, 2014

(87) PCT Pub. No.: WO2013/076093
PCT Pub. Date: May 30, 2013

(65) Prior Publication Data
US 2014/0293569 A1    Oct. 2, 2014

(30) Foreign Application Priority Data

Nov. 25, 2011 (FR) .................................. 11 60825

(51) Int. Cl.
| | |
|---|---|
| H05K 7/02 | (2006.01) |
| H05K 7/04 | (2006.01) |
| H01R 13/516 | (2006.01) |
| B60L 3/00 | (2006.01) |
| B60L 15/00 | (2006.01) |
| H05K 7/14 | (2006.01) |

(52) U.S. Cl.
CPC ............ *H01R 13/516* (2013.01); *B60L 3/0007* (2013.01); *B60L 15/007* (2013.01); *H05K 7/14* (2013.01); *Y02T 10/645* (2013.01)

(58) Field of Classification Search
USPC .......... 361/728–730, 796, 752, 807, 809, 810
See application file for complete search history.

(56) References Cited

U.S. PATENT DOCUMENTS

| | | | |
|---|---|---|---|
| 5,673,173 A | * | 9/1997 | Tsai .......................... 361/679.43 |
| 7,484,581 B2 | | 2/2009 | Yamafuji |

(Continued)

FOREIGN PATENT DOCUMENTS

| | | |
|---|---|---|
| DE | 10 2009 032 172 | 1/2011 |
| EP | 0 838 982 | 4/1998 |

OTHER PUBLICATIONS

International Search Report Issued Dec. 20, 2012 in PCT/EP12/073129 Filed Nov. 20, 2012.

(Continued)

*Primary Examiner* — Hung S Bui
(74) *Attorney, Agent, or Firm* — Oblon, McClelland, Maier & Neustadt, L.L.P.

(57) ABSTRACT

A protective device is for an electrical connector of a power electronics module inserted in a casing. The connector protrudes from one of the faces of the casing and is suitable to connect an electrical supply line to the module. The device includes at least one face for covering at least partially the connector so as to protect the connector between the face of the casing and the at least one face of the device. The device can bear on the casing when a force is applied in the direction of the casing on the at least one face of the device.

13 Claims, 2 Drawing Sheets

(56) References Cited

U.S. PATENT DOCUMENTS

| | | | |
|---|---|---|---|
| 8,064,234 B2 * | 11/2011 | Tokuyama et al. | 363/141 |
| 8,897,003 B2 * | 11/2014 | Ishii | 361/679.4 |
| 2009/0095557 A1 | 4/2009 | Yajima | |
| 2012/0087095 A1 * | 4/2012 | Tokuyama et al. | 361/721 |
| 2014/0160822 A1 * | 6/2014 | Kuwano et al. | 363/141 |

OTHER PUBLICATIONS

French Search Report Issued in French Patent Application No. 1160825 Filed Nov. 25, 2011.

* cited by examiner

PROTECTIVE DEVICE FOR AN ELECTRICAL CONNECTOR OF A POWER ELECTRONICS MODULE

BACKGROUND

The present invention generally relates to the field of mechanics and more precisely to a device for protecting against impact an electrical connector for supplying high-voltage power to an electrical power train.

Indeed, conventional motor vehicles, i.e. combustion-powered vehicles, have various safety devices for limiting the risks to the driver and the passengers thereof in the instance of impact. Electric vehicles, which are less popular, benefit from the same devices but also require other protective mechanisms, particularly against the electrical risks in the instance of impact. The connectors for the high-voltage supply lines of the electrical power train of such a vehicle must particularly be protected.

The U.S. Pat. No. 7,484,581 discloses a protective mechanism for such a connector in the case of impact. This mechanism consists of support arms for fixing, to the chassis of an electric vehicle, both the inverter powering the power train thereof, and the electrical connector of the inverter. Therefore, in the case of impact, the deformation of the chassis produces an identical translation movement for the inverter and the connector thereof. The high-voltage line at the output of the inverter is therefore not disconnected from the inverter, limiting the electrical risks for the vehicle driver and the passengers thereof.

However, this protective mechanism is not sufficiently strong in the case of a violent frontal impact on the vehicle, particularly if the inverter is incorporated on the motor unit of the vehicle, since the weight of this motor unit would make it move back independently of the deformation of the chassis if such a frontal impact occurred. This protective mechanism does not, therefore, allow flexibility in terms of architecture of the electric vehicle, with the inverter having to be hooked to the chassis for this mechanism to function. This constraint is particularly inconvenient when the aim is to limit the spatial requirement of the power electronics modules associated with the power train of the vehicle.

BRIEF SUMMARY

One of the aims of the invention is to overcome at least some of the disadvantages of the prior art by providing a protective device for an electrical connector of a power electronics module, and a power train provided with such a device, which allow this connector to be effectively protected in the case of violent frontal impact.

To this end, the invention proposes a protective device for an electrical connector of a power electronics module inserted in a casing, said connector protruding from one of the faces of said casing and being suitable to connect an electrical supply line to said module, characterized in that said device includes at least one face for covering at least partially said connector so as to protect, or comprise, said connector between said face of said casing and said at least one face of the device, wherein said device can bear on said casing when a force is applied in the direction of the casing on said at least one face of the device.

By virtue of the invention, a power electronics module of a vehicle, for example, can be incorporated in the motor unit without having to be fixed to the chassis thereof, while having the electrical connector(s) thereof protected in the case of impact. In particular, by assuming, for example, that these electrical connectors are positioned towards the front of the vehicle, and are protected by the protective device according to the invention, then in the case of frontal impact, said at least one face of the protective device receiving this impact will bear directly on the casing of the power module. The electrical connectors move back, therefore, at the same time as the motor unit without being damaged.

Said module which benefits from the protective device according to the invention is, for example, a power electronics module of an electrical power train of a vehicle and said supply line is a high-voltage power bus of said power train.

It is, indeed, desirable to protect first and foremost the high-voltage connectors of electric vehicles.

According to an advantageous feature of the invention, the device according to the invention includes a recess for allowing said high-voltage power bus to exit said connector in a direction that is orthogonal to said force.

Therefore, the device protects the electrical connector while allowing the power bus to exit the device in a direction that does not risk damaging this bus in the case of impact.

According to another advantageous feature, the device according to the invention includes an additional face orthogonal to said at least one face of said device, said additional face including at least:

a first surface for bearing on said face of said casing including the connector, and a second surface which can be fixed on a face of said casing, which is lateral to said face of said casing including said connector, said second surface protruding from said additional face in relation to said first surface.

This feature allows the protective device to be fixed to the casing, for example, by means of holes and screws located on the second surface, at locations which are behind the first bearing surface and therefore protected during frontal impact, and this allows the fixings to remain intact during this impact.

According to another advantageous feature, the device according to the invention is formed from a single piece of sheet steel. Therefore, the manufacture of the device according to the invention is simple and inexpensive.

According to another advantageous feature, the device according to the invention includes ribbed profiles.

These ribbed profiles allow the device to be strengthened and made more resistant to impact.

According to another advantageous feature, said at least one face of the device comprises a recess for allowing a low-voltage supply line to enter, in a substantially parallel manner to said force, via said face of said casing supporting said connector.

Therefore, the device allows an electrical architecture to be designed in a flexible manner in relation to the spatial requirement problems, wherein certain power buses that are less critical in the case of impact can be placed at the front of the motor unit.

The invention also relates to an electrical power train for an electric vehicle, including at least one power electronics module protected in a casing, said casing including a face supporting a connector protruding from said face and suitable to connect an electrical supply line to said module, characterized in that said connector is protected by the protective device according to the invention, and in that said face of said casing supporting said connector includes at least one arch for allowing said at least one face of the protective device to bear on said arch when said force is applied to said at least one face of the device according to the invention.

The arch on the casing allows the protective device according to the invention to be produced with a reduced sheet piece, for example sheet metal folded along two planes at 90°, wherein one of the planes can rest on this arch. Indeed, in this case, one of the planes partially covers the connector while resting on this arch, whereas the other plane rests on the casing and allows the device to be fixed. Such a protective device including only two planes allows simple manufacture overcoming the tolerance range problems linked to the dimensions of the casing. Indeed, the casing is often produced in two parts, and the height thereof is therefore subject to an error range that is inconvenient for producing a protective device in the shape of a sheet folded into a U for example.

Advantageously, said arch is a piece cast in a rigidly connected manner with said casing. This feature further facilitates the manufacture of the power train according to the invention.

According to another advantageous feature, said face of said casing including said connector includes at least one arch located under a horizontal plane defining said connector and said arch.

This feature allows a protective device according to the invention to be produced in the form of a sheet folded at 90° and positioned on the top of the power train. The maintenance of the power train is thereby facilitated, since the protective device has a limited spatial requirement and can be removed from the casing without having to access fixings located under the connector.

BRIEF DESCRIPTION OF THE DRAWINGS

Other features and advantages will emerge upon reading a preferred embodiment described with reference to the figures wherein.

DETAILED DESCRIPTION

Figure 1:
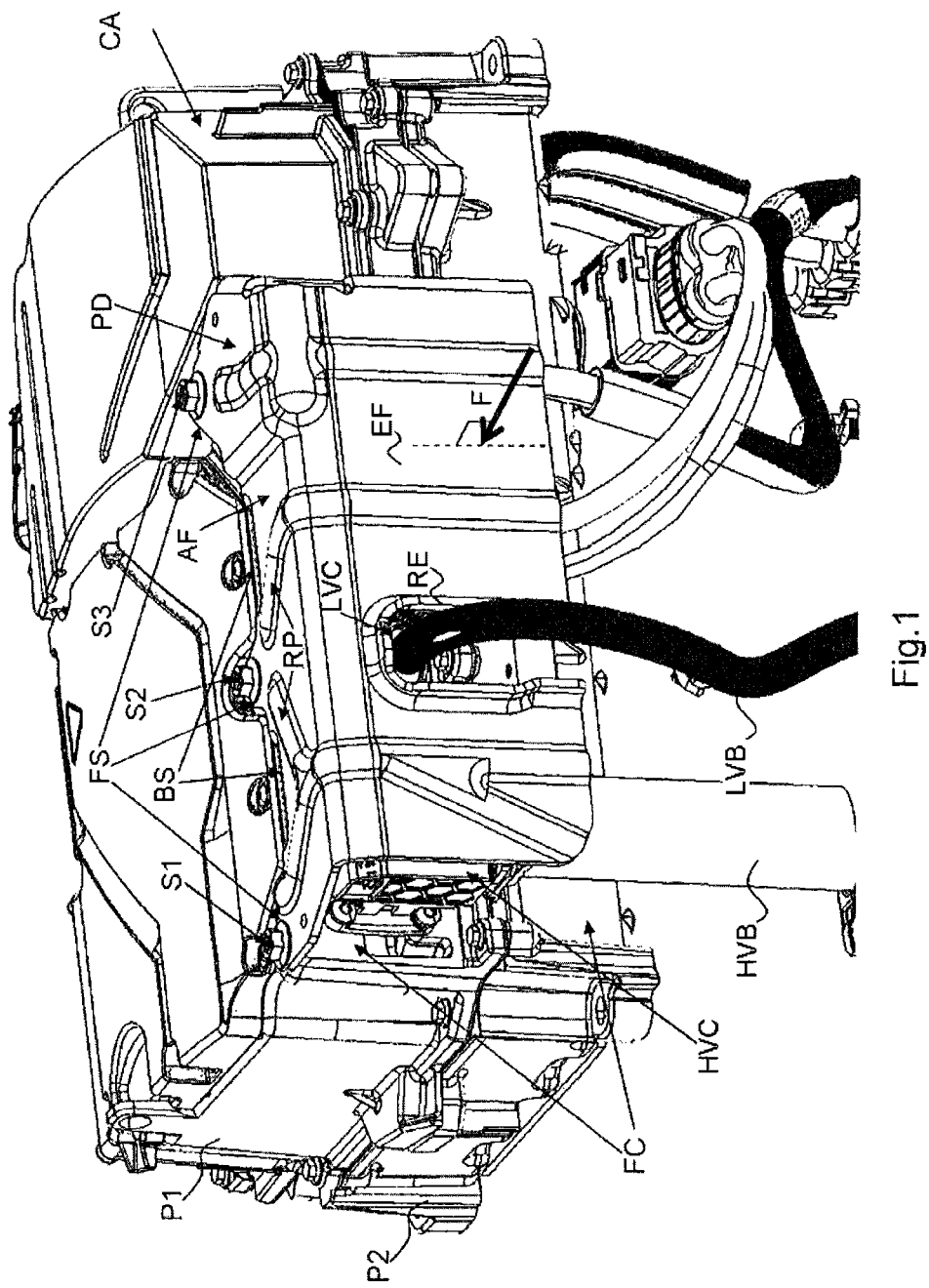
FIG. 1 shows a top view of the protective device according to the invention in this preferred embodiment.

According to a preferred embodiment of the invention shown in FIG. 1, a protective device PD according to the invention protects an electrical connector HVC for powering, via a high-voltage power bus HVB, a power electronics module, such as an inverter, inserted in a casing CA of an electrical power train of a vehicle.

The casing CA is formed from two cast aluminum pieces, i.e. a lower piece P2 and an upper piece P1, which are fixed together by means of bolts. In this preferred embodiment according to the invention, the casing CA encloses not only the power electronics module powered by the electrical connector HVC, but also other power electronic modules and the traction electric machine of the vehicle.

The electrical connector HVC protrudes from a front face FC of the casing CA. The high-voltage power bus HVB of the power electronics module exits the electrical connector HVC vertically and downwards. Other high-voltage electrical connectors, as well as an electrical connector LVC for connecting to the power train a low-voltage supply line LVB connected to a low-voltage supply network of the vehicle, protrude from the face FC of the casing CA. The high-voltage electrical connectors are protected by the protective device PD particularly against a frontal impact, i.e. directed to the front of the vehicle, according to a force F. The low-voltage electrical connector LVC exits the protective device PD via a recess RE of the protective device PD, in a direction opposite the force F. The electrical bus LVB is therefore not protected against a frontal impact but the electrical connector LVC thereof is, since it is located between the front face FC of the casing CA and an end face EF of the protective device according to the invention. This end face EF is substantially parallel to the front face FC of the casing CA.

It should be noted that, in this application, the expression "face", without mention to the contrary, designates not only the inner wall of a plane but also the outer wall thereof.

Therefore, in this embodiment of the invention, the protective device PD is formed from a single piece of sheet steel folded substantially at 90°, including two faces, i.e. an end face EF and a lateral additional face AF. This sheet piece is produced from buckled sheet with a thickness of 3 mm approximately.

It is fixed to the casing CA laterally in relation to the front face FC of the casing, by three screws S1, S2 and S3 having an 8 millimeter diameter, at fixing surfaces FS protruding from the lateral additional face AF in relation to the bearing surfaces BS in contact with the front face FC of the casing. These bearing surfaces BS of the lateral additional face AF, which are also called "antibursts", are located in a horizontal plane lower than that of the fixing surfaces FS. Indeed, the sheet piece forming the protective device PD is worked such that the fixing surfaces FS are positioned on the top of the casing while the bearing surfaces BS are in contact with the upper edge of the front face FC of the casing. In the case of frontal impact, this allows the fixing screws S1, S2 and S3 to be protected and, therefore, the protective device PD to be prevented from sliding towards the casing.

In an alternative, other fixing means can be envisaged instead of the screws S1, S2 and S3, such as welds or studs with nuts.

The protective device PD also includes ribbed profiles RP for strengthening the assembly. The arrangement thereof on the lateral additional surface AF particularly allows the screws S1, S2 and S3 to be effectively protected against frontal impact, in addition to the action of the "antibursts" formed by the bearing surfaces BS. These ribbed profiles can, for example, be obtained by embossing.

Figure 2:
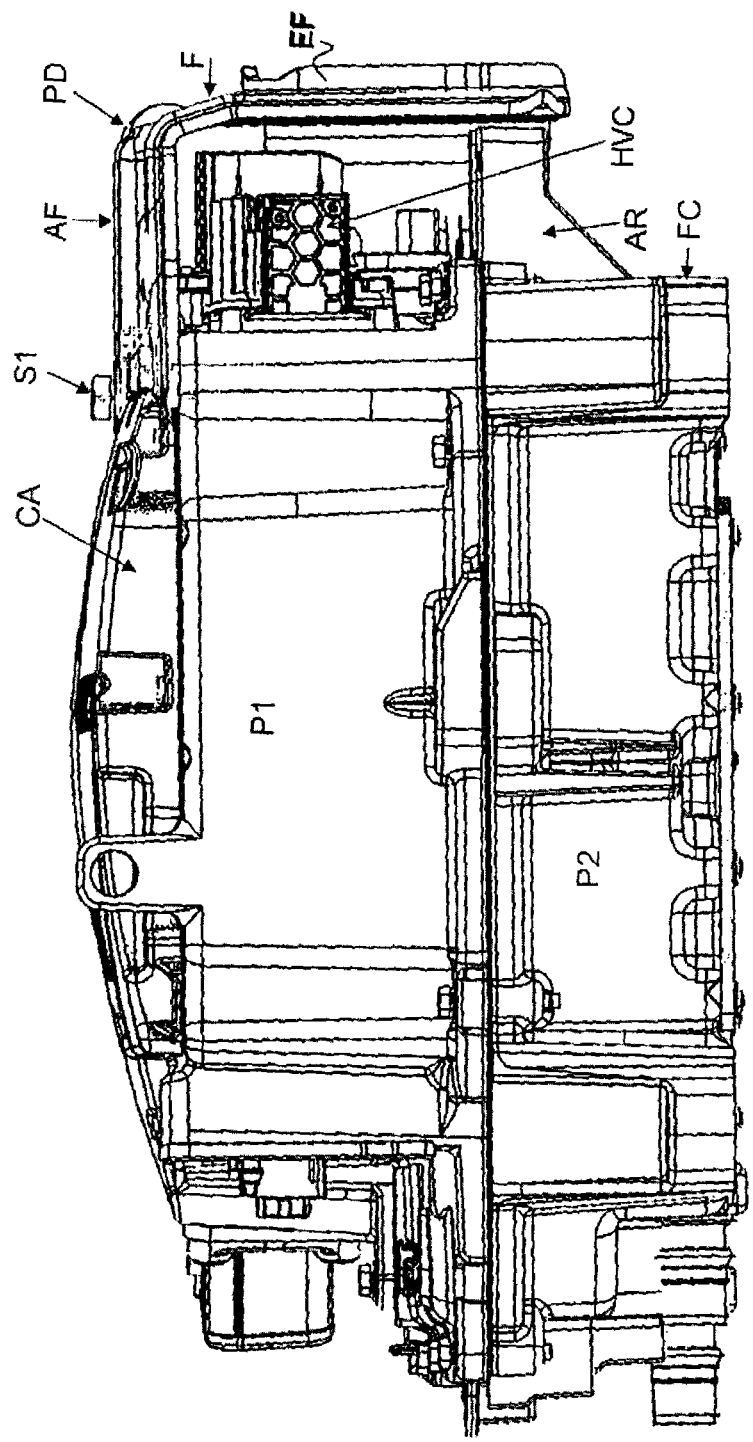
FIG. 2 shows a side view of the protective device according to the invention in this preferred embodiment.

The protection, against frontal impact, of the electrical connectors exiting the casing is provided by the protective device PD which bears on the casing in response to the force F, and not on the connectors. The bearing points are located, in this embodiment of the invention:

at the bearing surfaces BS on the upper edge of the front face FC of the casing and at arches AR which can be seen in FIG. 2, which extend the front face FC of the casing CA beyond the electrical connectors. These arches AR are cast in a rigidly connected manner with the aluminum piece P2 of the casing.

The high-voltage electrical power buses can move freely between the arches AR of the casing CA, vertically and downwards, which prevents them from being cut in the case of frontal impact.

By virtue of the invention, the high-voltage electrical connectors of the power train are, therefore, effectively protected against a frontal impact. Moreover, the protective device is not cumbersome: the three screws S1, S2 and S3 must simply be unscrewed in order to remove the protective device PD from the casing CA, which facilitates the maintenance of the electrical power train.

It should be noted that, although, in this preferred embodiment of the invention, several arches and several "antibursts" are used, alternative embodiments can be considered, using, for example, a single "antiburst" and a single central arch. Other embodiments are also possible, wherein, for example, the casing includes arches on the two cast pieces P1 and P2, in which case the protective device according to the invention would be limited to a single-face piece, or, by contrast, wherein the protective device would form a cover formed from an end face and two lateral faces each bearing on the casing, wherein these lateral faces could be possibly minimized in the form of bearing feet. Moreover, the protective device according to the invention does not have to be produced from buckled sheet steel. It is possible to cast it in a rigidly connected manner with the pieces P1 and P2. In the latter case, it would be formed from two pieces joined to form the casing and the electrical connector protective device thereof.

The invention claimed is:

1. A protective device for an electrical connector of a power electronics module inserted in a casing, said connector protruding from one of the faces of said casing and being suitable to connect an electrical supply line to said module, said device comprising:
    at least one face for covering at least partially said connector so as to protect said connector between said face of said casing and said at least one face of the device; and
    an additional face orthogonal to said at least one face of said device, said additional face including at least:
        a first surface to bear on said face of said casing including the connector, and
        a second surface to be fixed on a lateral face of said casing, which is lateral to said face of said casing including said connector, said first surface being located in a horizontal plane that is lower than that of said second surface,
    wherein said device can bear on said casing when a force is applied in the direction of the casing on said at least one face of the device.

2. The protective device as claimed in claim 1, wherein said module is a power electronics module of an electrical power train of a vehicle and said supply line is a high-voltage power bus of said power train.

3. The protective device as claimed in claim 2, further comprising:
    a recess for allowing said high-voltage power bus to exit said connector in a direction that is orthogonal to said force.

4. The protective device as claimed in claim 1, wherein the protective device is formed from a single piece of sheet steel.

5. The protective device as claimed in claim 1, further comprising:
    ribbed profiles located on at least the additional face of the device.

6. The protective device as claimed in claim 1, wherein said at least one face of the device comprises a recess for allowing a low-voltage supply line to enter, in a substantially parallel manner to said force, via said face of said casing supporting said connector.

7. An electrical power train for an electric vehicle, comprising:
    at least one power electronics module protected in a casing, said casing including a face supporting a connector protruding from said face and suitable to connect an electrical supply line to said module, wherein
    said connector is protected by the protective device as claimed in claim 1, and
    said face of said casing supporting said connector includes at least one arch for allowing said at least one face of the protective device to bear on said arch when said force is applied to said at least one face of the device.

8. The power train as claimed in claim 7, wherein said arch is a piece cast in a rigidly connected manner with said casing.

9. The power train as claimed in claim 7, wherein said face of said casing including said connector includes at least one arch located under a horizontal plane defining said connector and said arch.

10. The power train as claimed in claim 7, wherein the connector includes a recess through which said supply line exits said connector in a direction that is orthogonal to said force.

11. The power train as claimed in claim 10, wherein said module is a power electronics module of an electrical power train of a vehicle and said supply line is a high-voltage power bus of said power train.

12. The power train as claimed in claim 7, wherein the second surface is fixed to the lateral face of the casing via screws passing through the second surface and the lateral face of the casing.

13. A protective device for an electrical connector of a power electronics module of an electrical power train of a vehicle inserted in a casing, said connector protruding from one of the faces of said casing and being suitable to connect a high-voltage power bus of said power train to said module, said device comprising:
    at least one face for covering at least partially said connector so as to protect said connector between said face of said casing and said at least one face of the device; and
    a recess,
    wherein said device can bear on said casing when a force is applied in the direction of the casing on said at least one face of the device, and
    wherein said high-voltage power bus exits said connector via the recess in a direction that is orthogonal to said force.

* * * * *